United States Patent [19]

Yamazaki et al.

[11] Patent Number: 5,036,794
[45] Date of Patent: Aug. 6, 1991

[54] CVD APPARATUS

[75] Inventors: Shunpei Yamazaki; Mamoru Tashiro; Minoru Miyazaki; Mitsunori Sakama; Takeshi Fukada, all of Tokyo, Japan

[73] Assignee: Semiconductor Energy Laboratory Co., Ltd., Kanagawa, Japan

[21] Appl. No.: 498,474

[22] Filed: Mar. 23, 1990

Related U.S. Application Data

[63] Continuation of Ser. No. 135,463, Dec. 21, 1987, abandoned, which is a continuation of Ser. No. 849,292, Apr. 8, 1986, abandoned.

[30] Foreign Application Priority Data

Apr. 8, 1985 [JP] Japan ................................ 60-075051

[51] Int. Cl.⁵ .............................................. C23C 16/00
[52] U.S. Cl. ................................... 118/723; 118/50.1; 118/500; 118/728
[58] Field of Search ............... 118/715, 723, 724, 728, 118/50.1, 500; 427/39

[56] References Cited

U.S. PATENT DOCUMENTS

| 3,682,699 | 8/1972 | Koga et al. | 156/613 |
| 4,033,287 | 7/1977 | Alexander, Jr. et al. | 118/725 |
| 4,287,851 | 9/1981 | Dozier | 427/39 |
| 4,424,096 | 1/1984 | Kumagai | 118/728 X |
| 4,576,830 | 3/1986 | Kiss | 118/723 X |
| 4,582,720 | 4/1986 | Yamazaki | 118/723 X |
| 4,593,644 | 6/1986 | Hanak | 118/723 |
| 4,633,809 | 1/1987 | Hirose et al. | 118/723 |

FOREIGN PATENT DOCUMENTS 0224215  11/1985  Japan ................................. 118/723

Primary Examiner—Richard Bueker
Attorney, Agent, or Firm—Sixbey, Friedman, Leedom & Ferguson

[57] ABSTRACT

A CVD apparatus in which a reaction chamber includes a pair of electrodes which define a plasma generating space therebetween. A metallic enclosure surrounds the plasma generating space thereby preventing plasma which has been produced within the space from escaping. The enclosure can be utilized to support one or more substrates to be coated.

4 Claims, 2 Drawing Sheets

CVD APPARATUS

This application is a continuation of Ser. No. 07/135,463, filed Dec. 21, 1987 now abandoned, which is a continuation of application Ser. No. 06/849,292, filed Apr. 8, 1986, now abandoned.

BACKGROUND OF THE INVENTION

1. Field of the Invention

The present invention relates to a CVD apparatus for depositing films on substrates through a CVD epitaxial growth process.

2. Description of the Prior Art

A variety of CVD apparatus have heretofore been proposed but they encounter difficulty in forming a film uniformly all over a substrate surface of a large area.

SUMMARY OF THE INVENTION

An object of the present invention is to provide a CVD apparatus which is free from such a defect of the prior art.

According to the present invention, since a substrate holder which is placed in a reaction chamber is formed by a conductive tubular member which guides a reactive gas, films can be deposited on substrates without the above defect of the prior art.

Other objects, features and advantages of the present invention will become more fully apparent from the following detailed description taken in conjunction with the accompanying drawings.

DESCRIPTION OF THE PREFERRED EMBODIMENTS

Figure 1:
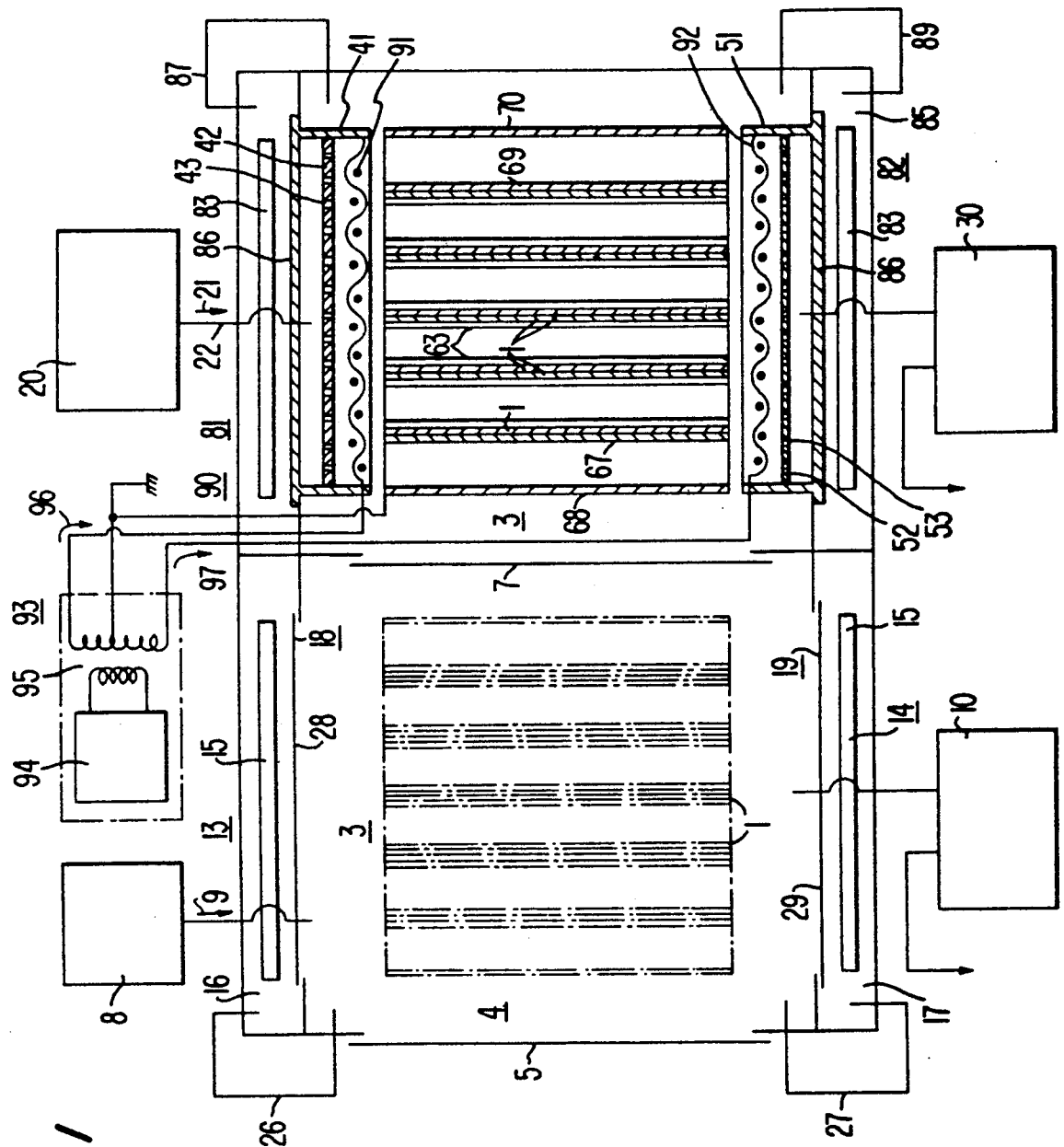
FIG. 1 is a longitudinal-sectional view schematically illustrating an example of the CVD apparatus of the present invention.
Figure 2:
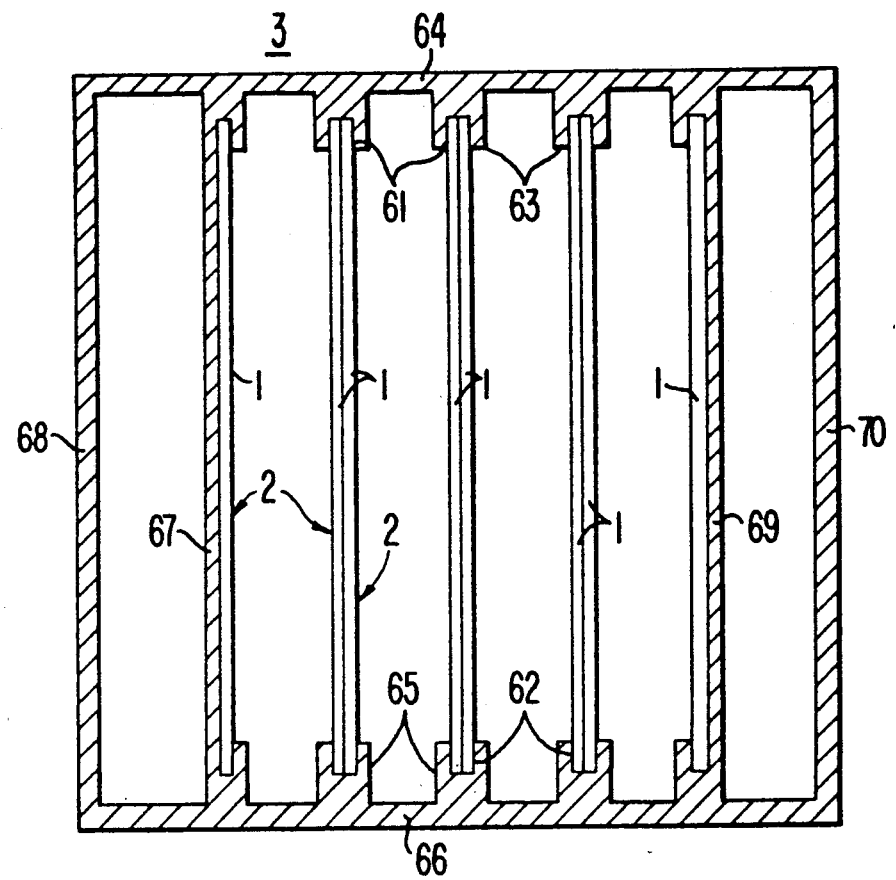
FIG. 2 is a schematic cross-sectional view of its principal part.

A description will be given first, with reference to FIGS. 1 and 2, of an example of the CVD apparatus of the present invention, along with a process for forming a film on a substrate by the CVD method through utilization of the apparatus.

One or more substrates 1 are placed in a substrate introducing/removing chamber 4, opening its window 5. The substrate introducing/removing chamber 4 is presupplied with an inert gas 9 from an inert gas supply source 8 so that the pressure in the chamber 4 is equal to the atmospheric pressure. The substrates 1 are mounted on a substrate holder 3 in the substrate introducing/removing chamber 4.

Next, the substrates 1 are heated by heating means 13 and 14 from the outside of the substrate introducing/removing chamber 4, and the substrate introducing/removing chamber 4 is evacuated by an evacuating means 10, removing accressions on the substrates 1 and the substrate holder 3. The heating means 13 and 14 each have a heater 15 which is an infrared ray lamp, for instance, and they are respectively disposed in heating chambers 16 and 17 which are linked with the substrate introducing/removing chamber 4 through partition means 18 and 19, each having upper and lower windows 28 and 29 which permit the passage therethrough of heat rays. The heating chambers 16 and 17 communicate with the substrate introducing/removing chamber 4 via pipes 26 and 27, respectively.

Next, the substrates 1 mounted on the substrate holder 3 is placed in a reaction chamber 6, temporarily opening a shutter means 7 through which the reaction chamber 6 is linked with the substrate introducing/removing chamber 4 at one side thereof.

Next, a reactive gas 21 from a reactive gas supply source 20 is introduced via a pipe 22 into the reaction chamber 6 from above a downward hood 41 provided at an upper portion of the reaction chamber 6. The top of the hood 41 constitutes a part of the top wall of the reaction chamber 6. In the hood 41 a homogenizing plate 42 having a number of air holes 43 is disposed across the space defined by the hood 41.

In this instance, the reaction chamber 6 is evacuated, by an evacuating means 30 from the underside of another hood 51 provided upwardly at a lower portion in the chamber 6, thereby maintaining the reaction chamber 6 at a required pressure. The top of the hood 51 constitutes a part of the bottom wall of the reaction chamber 6. Also in the hood 51 a homogenizing plate 52 having a number of air holes 53 as is the case with the above-mentioned homogenizing plate 42 is disposed across the space defined by the hood 51.

The substrate holder 3 is, for example, a squarely-sectioned tubular member which, when placed in the reaction chamber 6, guides the reactive gas 21 from the inside of the hood 41 on the side of the reactive gas supply source 20 to the inside of the hood 51 on the side of the evacuating means 30, in cooperation with them, and holds the substrates 1 so that each surface 2 of them to be deposited with a film extends along the stream of the guided reactive gas. The tubular member 3 holds each substrate 1 between a pair of opposed grooves 61 and 62 which are respectively defined by a pair of inward projections 63 formed on the inside of the rear panel 64 of the tubular member 3 and extending vertically thereof and another pair of inward projections 65 similarly formed on the inside of the front panel 66 of the tubular member 6 and extending vertically thereof. In practice, the tubular member 3 has a plurality of such pairs of substrate receiving projections arranged at required intervals; accordingly, the substrate holder 3 carries a plurality of substrates 1. Between the leftmost pair of substrate receiving projections 63 and 65 a partition plate 67, which faces the left-hand wall 65 of the tubular member 6, extends from the outside of the projections 63 and 65. Similarly a partition plate 69, which faces the right-hand wall 70 of the tubular member 6, extends between the rightmost pair of substrate receiving projections 63 and 64 from the outside thereof. The tubular member 3 holds, in practice, a pair of substrates 1 back between each pair of substrate receiving projections 63 and 65, except the leftmost and rightmost pairs of projections 63 and 65.

The tubular member 3 inclusive of the substrate receiving projections 63 and 65 and the partition plates 67 and 69, is conductive and made of aluminum, stainless steel, or nickel. The reaction chamber 6 and the hoods 41 and 42 are also conductive.

After the substrates 1 mounted on the tubular member 3 as described above are placed in the reaction chamber 6, the reactive gas 21 is introduced into the reaction chamber 6, wherein it is guided to flow through the tubular member 3. At the same time, the substrates 1 are heated by the heating means 81 and 82 from the outside of the reaction chamber 6. The heating means 81 and 82 each have a heater 83 similar to that of each of the aforementioned heating means 13 and 14. The heating means 81 and 82 are respectively disposed in heating chamber 84 and 85 which are linked with the reaction chamber 6 through the tops of the hoods 41 and 51, each having a window 86 which permits the passage therethrough of heat rays. The heating chambers 84 and 85 communicate with the reaction chamber 6 via pipes 87 and 89, respectively.

Next, the reactive gas 21 introduced into the reaction chamber 6 is excited by an exciting means 90.

The exciting means 90 comprises a permeable-to air, and accordingly mesh-like electrode 91, for example, which is positioned in the hood 91 below the homogenizing plate 42, a similar electrode 92 which is positioned in the hood 51 above the homogenizing plate 52, and a power supply means 93 which applies from the outside of the reaction chamber 6 to the electrodes 91 and 92 with power for producing a plasma discharge. The power supply means 93 comprises a high-frequency oscillator 94 and a converter 95 which converts, for example, a high frequency wave of 13.56 MHz, into two 180° out-of-phase high frequency waves 96 and 97 and provides them to the electrodes 91 and 92, respectively. The converter 95 may be formed by a transformer structure which comprises a primary coil for receiving the high frequency wave directed from the oscillator and two secondary coils electromagnetically coupled therewith and in which the secondary coils are connected at one end to the electrodes 91 and 92, respectively, and at the other end to the wall of the reaction chamber 6 and the tubular member 3.

The reactive gas 21 is rendered into a plasma by an electric field which is set up between the electrodes 91 and 92 by the activation of the exciting means 90. The reactive gas 21 in plasma form makes contact with the surfaces 2 of the substrates 1. At this time, since the substrates 1 are heated by the heating means 81 and 82, films 100 are deposited on the substrate surfaces 2 by epitaxial growth. The reactive gas in plasma form, which does not take part in the formation of the films 100, is discharged to the outside through the evacuating means 30.

In this instance, the electric field between the electrodes 91 and 92 is established by applying thereacross 180° out-of-phase high frequencies. Since the electric field thus created is directed along the flow of the reactive gas 21 and the substrate surfaces 2, the reactive gas 21 is efficiently rendered into a plasma uniformly throughout the region extending along the substrate surfaces 2. Consequently, the films 100 are each formed to the same thickness all over the substrate surface 2. Such an effect is remarkable in the cases where the tubular member 3 is conductive and made of aluminum (Al) and letting the distance between adjacent substrates 1, the length of each substrate 1 and the pressure in the reaction chamber 6 be represented by d (cm), L (cm), and P (Torr), respectively, they bear a relation $(L \times P)/d \leq 0.4$ (Torr), where the tubular member 3 is made of nickel (Ni) or chromium (Cr) and the abovesaid elements bear a relation $(L \times P)/d \leq 0.6$ (Torr), and where the tubular member 3 is made of stainless steel and the above elements bear a relation $(L \times P)/d \leq 0.8$ (Torr).

Moreover, since the hoods 41 and 42 are also conductive and since the homogenizing plates 51 and 52 for the reactive gas are respectively disposed in the hoods 41 and 42, the above-said effect is further heightened.

The tubular member 3 and the hoods 41 and 42 are made of a conductive material, and hence they can be produced more easily and more sturdy than in the case where they are made of an insulating material. Therefore, the tubular member 3 and the hoods 41 and 42 can easily be formed large, making it possible to deposit the film uniformly all over the substrate surface 2 of a large area measuring 30 by 30 cm, for example.

After the formation of the films 100 to a required thickness on the substrate surfaces 2, heating of the substrates 1 by the heating means 81 and 82 and the activation of the exciting means 93 are stopped, which is followed by stopping of the introduction of the reactive gas 21 into the reaction chamber 6.

Next, the substrates 1 are brought back into the substrate introducing/removing chamber 4 through use of the tubular member 3, temporarily opening the shutter means 7.

Next, the substrates 1 are dismounted from the tubular member 3 in the substrate introducing/removing chamber 4 and then take out therefrom opening the window 5.

After the removal of the substrates 1 from the reaction chamber 6 into the substrate introducing/removing chamber 4, the reaction chamber 6 is cleaned, as required, by introducing thereinto, for instance, a fluoride gas from the reactive gas supply source 20 and activating the exciting means 93, thereby rendering the fluoride gas into a plasma to perform plasma etching of the interior of the reaction chamber 6. In this instance, when the electrodes 91 and 92 are made of aluminum or an aluminum alloy, or covered with such a material, they will not be unnecessarily etched by the plasma because they have resistance to the fluoride gas.

A series of steps for forming the films on the substrates 1 terminates with their removal from the substrate introducing/removing chamber 4.

With the film forming method employing the above CVD apparatus of the present invention, the reactive gas 21 is excited within the limited space of the tubular member 3; so that even if the above plasma etching is not the interior surfaces of the reaction chamber 6 after the deposition of the films.

With the CVD apparatus of the present invention, it is possible to form silicon films by using silane as the reactive gas, silicon nitride films by using silane and ammonia, silicon oxide films by using monosilane and nitrogen peroxide, and titanium nitride films by using titanium and nitrogen. Furthermore, it is also possible to form semiconductor layers doped with an impurity which imparts a conductivity type, insulating layers, or metallic layers as of titanium, molybdenum, or tungsten by using various other reactive gases.

Figure 3:
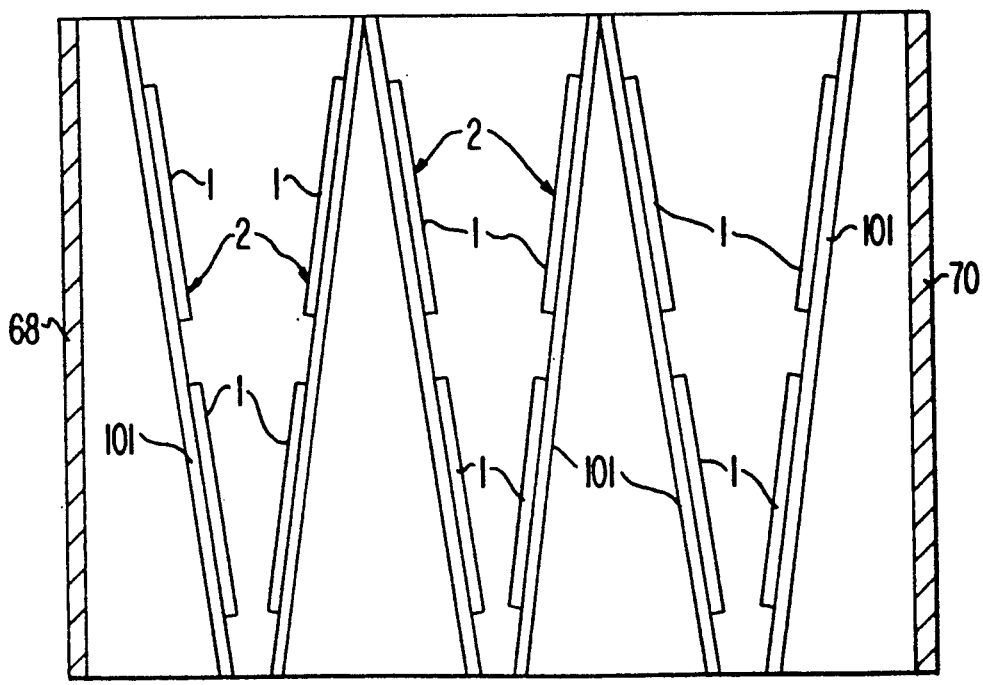
FIG. 3 is a schematic longitudinal-sectional view illustrating the principal part of another example of the CVD apparatus of the present invention.

Incidentally, the foregoing description should be construed as being merely illustrative of the present invention and should not be construed as limiting the invention specifically thereto. For example, it is also possible to adopt an arrangement in which films are deposited on the substrates 1 mounted on a support plate 101 held aslant by the tubular member 3, as depicted in FIG. 3.

It will be apparent that may modifications and variations may be effected without departing from the scope of the novel concepts of the present invention.

What is claimed is:

1. A CVD apparatus comprising:

a reaction chamber including a plasma generating space;

a pair of electrodes located in said reaction chamber and defining said plasma generating space therebetween;

a vacuum pump for evacuating said reaction chamber;

a grounded metallic enclosure totally surrounding said plasma generating space between said electrodes;

a voltage source for supplying said pair of electrodes with voltages in substantial opposite phase;

a substrate holder for supporting a substrate where the surface to be coated of the substrate is supported substantially in parallel to the electric field established between said pair of electrode by the voltage source; and wherein said metallic enclosure prevents plasma gas produced within said plasma generating space by a discharge induced between said electrodes from escaping from said plasma generating space.

2. The apparatus of claim 1 wherein said enclosure supports at least one substrate to be coated.

3. The apparatus of claim 1 wherein said enclosure is formed with an open top and an open bottom, near which said electrodes are placed respectively.

4. The apparatus of claim 1 wherein said enclosure is made of Al, Cr, Ni, or stainless steel.

* * * * *